(12) United States Patent
Tsuda et al.

(10) Patent No.: US 9,123,861 B2
(45) Date of Patent: Sep. 1, 2015

(54) SOLAR BATTERY, MANUFACTURING METHOD THEREOF, AND SOLAR BATTERY MODULE

(75) Inventors: Yuki Tsuda, Tokyo (JP); Hirofumi Konishi, Tokyo (JP); Tsutomu Matsuura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/359,193

(22) PCT Filed: May 7, 2012

(86) PCT No.: PCT/JP2012/061640
§ 371 (c)(1),
(2), (4) Date: May 19, 2014

(87) PCT Pub. No.: WO2013/094233
PCT Pub. Date: Jun. 27, 2013

(65) Prior Publication Data
US 2014/0322861 A1 Oct. 30, 2014

(30) Foreign Application Priority Data
Dec. 21, 2011 (JP) ................. 2011-280068

(51) Int. Cl.
*H01L 21/00* (2006.01)
*H01L 31/18* (2006.01)
(Continued)

(52) U.S. Cl.
CPC .......... *H01L 31/1888* (2013.01); *H01L 31/028* (2013.01); *H01L 31/02363* (2013.01); *H01L 31/022425* (2013.01);
(Continued)

(58) Field of Classification Search
CPC ................ H01L 31/03762; H01L 31/022466; H01L 31/02363; H01L 31/0747
See application file for complete search history.

(56) References Cited

U.S. PATENT DOCUMENTS

| 6,177,711 | B1* | 1/2001 | Kariya ..................... 257/458 |
| 2006/0065298 | A1 | 3/2006 | Nakashima et al. |
| 2009/0007955 | A1 | 1/2009 | Nakashima et al. |

FOREIGN PATENT DOCUMENTS

| JP | 07 263731 | 10/1995 |
| JP | 08 204216 | 8/1996 |
| JP | 10 275926 | 10/1998 |
| JP | 2000 058888 | 2/2000 |

(Continued)

OTHER PUBLICATIONS

International Search Report Issued May 29, 2012 in PCT/JP12/061640 Filed May 7, 2012.

*Primary Examiner* — Richard Booth
(74) *Attorney, Agent, or Firm* — Oblon, McClelland, Maier & Neustadt, L.L.P.

(57) ABSTRACT

A solar battery includes a transparent electrode and a collector electrode in this order on the surface of a light incident surface side of a photoelectric conversion layer. The collector electrode is formed in a predetermined region on the photoelectric conversion layer and a first transparent electrode of the transparent electrode is formed only in a region right under the collector electrode in contact with the photoelectric conversion layer and the collector electrode. A second transparent electrode of the transparent electrode is formed in a region on the photoelectric conversion layer where the collector electrode is not formed and on the collector electrode in contact with the photoelectric conversion layer or the collector electrode. The carrier concentration of the first transparent electrode is higher than the carrier concentration of the second transparent electrode.

9 Claims, 5 Drawing Sheets (51) Int. Cl.
*H01L 31/0224* (2006.01)
*H01L 31/028* (2006.01)
*H01L 31/0376* (2006.01)
*H01L 31/0236* (2006.01)
*H01L 31/0747* (2012.01)

(52) U.S. Cl.
CPC ............. *H01L 31/022466* (2013.01); *H01L 31/022475* (2013.01); *H01L 31/022483* (2013.01); *H01L 31/03762* (2013.01); *H01L 31/0747* (2013.01); *Y02E 10/50* (2013.01)

(56) References Cited

FOREIGN PATENT DOCUMENTS

| | | |
|---|---|---|
| JP | 2000 299483 | 10/2000 |
| JP | 2001 102603 | 4/2001 |
| JP | 2004 214442 | 7/2004 |
| JP | 2005 191026 | 7/2005 |
| JP | 2006 100522 | 4/2006 |
| JP | 2006 222320 | 8/2006 |
| JP | 2011 077454 | 4/2011 |
| WO | 2011 024662 | 3/2011 |

* cited by examiner

SOLAR BATTERY, MANUFACTURING METHOD THEREOF, AND SOLAR BATTERY MODULE

FIELD

The present invention relates to a solar battery, a manufacturing method of the solar battery, and a solar battery module and, more particularly to a solar battery including a transparent electrode and a collector electrode on the light incident surface side in a photoelectric conversion layer, a manufacturing method of the solar battery, and a solar battery module.

BACKGROUND

Solar batteries that can directly convert sunlight into electric energy are expected as sources of alternative energy to oil. Among solar batteries, crystalline silicon solar batteries including crystalline silicon substrates have high photoelectric conversion efficiency and have already been widely put to practical use as solar power generation systems. Among crystalline silicon solar batteries, a crystalline silicon solar battery in which an amorphous silicon thin film having a band gap different from a band gap of monocrystalline silicon is formed on a monocrystalline silicon substrate surface to form diffusion potential is called hetero-junction solar battery.

Further, a solar battery in which a thin intrinsic amorphous silicon layer is interposed between a conductive amorphous silicon thin film and a crystalline silicon surface for forming diffusion potential is known as one of forms of a crystalline silicon solar battery having the highest photoelectric conversion efficiency. Because the thin intrinsic amorphous silicon layer is formed between the crystalline silicon surface and the conductive amorphous silicon thin film, it is possible to subject a defect (mainly a dangling bond of silicon) present on the surface of crystalline silicon to termination treatment with hydrogen while reducing generation of a new defect level due to the film formation. It is also possible to prevent carrier introduction impurities from diffusing to the crystalline silicon surface when the conductive amorphous silicon thin film is formed.

In recent years, from the viewpoint of material problems and costs of a crystalline silicon solar battery, there is an increasing demand for reducing the thickness of a monocrystalline silicon substrate in use. Therefore, a technique for efficiently confining light in a substrate is becoming important according to the decrease in the thickness of the monocrystalline silicon substrate. There is also an increasing demand for reducing a light absorption loss in a transparent electrode. However, when the carrier concentration of the transparent electrode is reduced in order to reduce the light absorption loss in the transparent electrode, the electric conductivity of the transparent electrode decreases. Therefore, compatibility of the light transmissivity and the electric conductivity of the transparent electrode is a problem.

Patent Literature 1 describes a solar battery including a transparent electrode formed on the surface of a photoelectric conversion layer and a collector electrode formed in a predetermined region on the transparent electrode. In the solar battery, the transparent electrode is formed in which a section in the vicinity of an interface with the photoelectric conversion layer and a section that corresponds to a region where the collector electrode is formed are set as a high conductivity region and the section other than these sections is set as a high light transmissivity region. However, in this form, the high conductivity region having a high light absorption coefficient is present in an optical path. Absorption of light increases, improvement of photoelectric conversion efficiency is small, and oxygen plasma treatment is performed to form the high light transmissivity region. Therefore, there is a problem in that electric conductivity is reduced by oxidation of silver, which is the collector electrode.

Patent Literature 2 discloses a crystalline silicon solar battery in which, by providing a region having high carrier concentration only in a region not substantially irradiated by incident light right under a collector electrode, a layer having high light transmissivity and having electric conductivity is formed in an optical path and a layer having high carrier concentration is present under the collector electrode. In this crystalline silicon solar battery, junction from a transparent electrode layer to the collector electrode is made satisfactory and photoelectric conversion efficiency has been improved.

CITATION LIST

Patent Literature

Patent Literature 1: Japanese Patent Application Laid-Open No. 2004-214442
Patent Literature 2: Japanese Patent Application Laid-Open No. 2011-77454

SUMMARY

Technical Problem

However, in the technology of Patent Literature 2, by forming only the region shaded by the collector electrode as a high-carrier concentration transparent electrode, a light absorption loss in the high-carrier concentration transparent electrode is eliminated and a reduction in series resistance is realized by improvement of junction from the transparent electrode to the collector electrode. However, an effect of the technology is not considered sufficient.

In Patent Literature 2, after the high-carrier concentration transparent electrode having a shape same as the shape of the collector electrode is formed, it is necessary to form the collector electrode on the high-carrier concentration transparent electrode. Therefore, an accurate alignment is necessary during the collector electrode formation. In this case, it is likely that deviation occurs in the position facing the collector electrode and the width of formation of the electrode. When the high-carrier concentration transparent electrode is exposed from the collector electrode, it is likely that a light absorption loss due to the exposed high-carrier concentration transparent electrode occurs. Further, when the width of the collector electrode is further reduced to attain an increase in an electric current, the likelihood thereof increases. Such a problem is a common problem in a solar battery including a transparent electrode and a collector electrode on a light incident surface side in a photoelectric conversion layer.

The present invention has been devised in view of the above and it is an object of the present invention to obtain a solar battery including a transparent electrode and a collector electrode on a light incident surface side in a photoelectric conversion layer, the solar battery being excellent in photoelectric conversion efficiency with a light absorption loss due to the transparent electrode suppressed and series resistance in the battery reduced, a manufacturing method of the solar battery, and a solar battery module.

Solution to Problem

To solve the above problems and achieve the object, a solar battery includes a transparent electrode and a collector electrode in this order on the surface of a light incident surface side of a photoelectric conversion layer. The collector electrode is formed in a predetermined region on the photoelectric conversion layer and a first transparent electrode of the transparent electrode is formed only in a region right under the collector electrode in contact with the photoelectric conversion layer and the collector electrode, a second transparent electrode of the transparent electrode is formed in a region on the photoelectric conversion layer where the collector electrode is not formed and on the collector electrode in contact with the photoelectric conversion layer or the collector electrode, and carrier concentration of the first transparent electrode is higher than carrier concentration of the second transparent electrode.

Advantageous Effects of Invention

According to the present invention, there is an effect that it is possible to obtain a crystalline silicon solar battery excellent in photoelectric conversion efficiency with a light absorption loss due to the transparent electrode suppressed and series resistance in the battery reduced.

BRIEF DESCRIPTION OF DRAWINGS

FIG. 2-1 is a sectional view for explaining an example of a procedure of a manufacturing method of the crystalline silicon solar battery according to the first embodiment.

FIG. 2-2 is a sectional view for explaining the example of the procedure of the manufacturing method of the crystalline silicon solar battery according to the first embodiment.

FIG. 2-3 is a sectional view for explaining the example of the procedure of the manufacturing method of the crystalline silicon solar battery according to the first embodiment.

FIG. 2-4 is a sectional view for explaining the example of the procedure of the manufacturing method of the crystalline silicon solar battery according to the first embodiment.

FIG. 2-5 is a sectional view for explaining the example of the procedure of the manufacturing method of the crystalline silicon solar battery according to the first embodiment.

FIG. 2-6 is a sectional view for explaining the example of the procedure of the manufacturing method of the crystalline silicon solar battery according to the first embodiment.

DESCRIPTION OF EMBODIMENTS

Embodiments of a solar battery, a manufacturing method of the solar battery, and a solar battery module according to the present invention are explained in detail below with reference to the drawings. Note that the present invention is not limited to the following description and can be changed as appropriate without departing from the spirit of the present invention. In the drawings referred to below, for easiness of understanding, scales of members are sometimes different from actual scales. The same applies among the drawings.

First Embodiment

Figure 1:
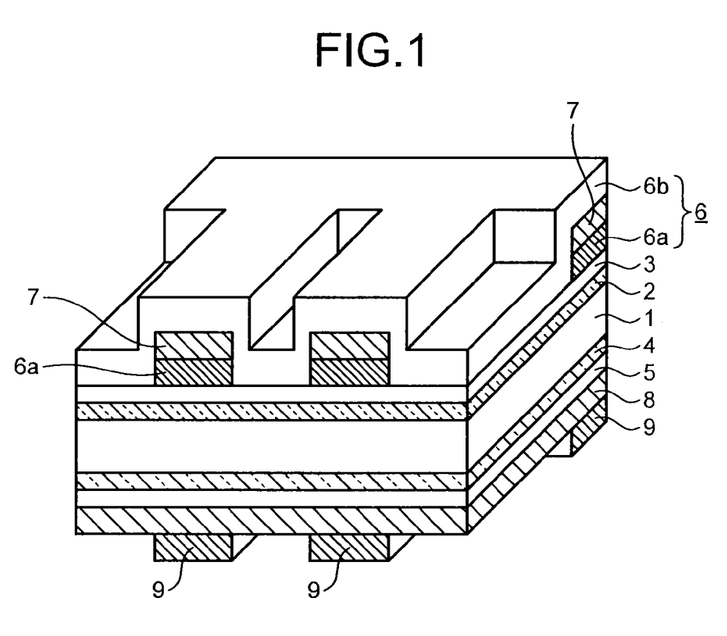
FIG. 1 is a main part perspective view of the schematic configuration of a crystalline silicon solar battery according to a first embodiment of the present invention.

FIG. 1 is a main part sectional view of the schematic configuration of a crystalline silicon solar battery according to a first embodiment of the present invention. In the crystalline silicon solar battery according to this embodiment, a substantially intrinsic i-type amorphous silicon thin film layer 2 and a p-type amorphous silicon thin film layer 3 are laminated in this order on one surface of an n-type monocrystalline silicon substrate 1 that configures a photoelectric conversion layer. A substantially intrinsic i-type amorphous silicon thin film layer 4 and an n-type amorphous silicon thin film layer 5 are laminated in order on the other surface of the n-type monocrystalline silicon substrate 1. The crystalline silicon solar battery includes a light-receiving surface side transparent electrode 6 and a light-receiving surface side collector electrode 7 in a predetermined region on the p-type amorphous silicon thin film layer 3. A rear surface side transparent electrode 8 is formed on the entire surface on the n-type amorphous silicon thin film layer 5. A rear surface side collector electrode 9 is formed in a predetermined region on the rear surface side transparent electrode 8. On the surface of the one surface side of the n-type monocrystalline silicon substrate 1, an uneven structure called texture is formed. The light-receiving surface side transparent electrode 6 includes a first transparent electrode 6a and a second transparent electrode 6b.

In the crystalline silicon solar battery, the light-receiving surface side collector electrode 7 is provided in the predetermined region on the p-type amorphous silicon thin film layer 3 as an electrode on the one surface side, which is a light incident surface side. The first transparent electrode 6a is provided in contact with the p-type amorphous silicon thin film layer 3 and the light-receiving surface side collector electrode 7 only in a region right under the light-receiving surface side collector electrode 7 on the p-type amorphous silicon thin film layer 3. That is, the light-receiving surface side collector electrode 7 is laminated only over the entire surface of a region right above the first transparent electrode 6a. The shapes of the first transparent electrode 6a and the light-receiving surface side collector electrode 7 are substantially the same in the surface direction of the n-type monocrystalline silicon substrate 1.

On the p-type amorphous silicon thin film layer 3, the second transparent electrode 6b is provided in a region where the light-receiving surface side collector electrode 7 is not provided and on the light-receiving surface side collector electrode 7. The second transparent electrode 6b is provided in contact with the p-type amorphous silicon thin film layer 3, the light-receiving surface side collector electrode 7, and the first transparent electrode 6a to cover the light-receiving surface side collector electrode 7 and the first transparent electrode 6a. Both of the first transparent electrode 6a and the second transparent electrode 6b have light transmissivity and electric conductivity. However, the first transparent electrode 6a has carrier concentration higher than the carrier concentration of the second transparent electrode 6b. Therefore, the first transparent electrode 6a has electric conductivity higher than the electric conductivity of the second transparent electrode 6b. The second transparent electrode 6b has light transmissivity higher than light transmissivity of the first transparent electrode 6a.

First, a monocrystalline silicon substrate in the crystalline silicon solar battery according to this embodiment is explained. In general, in the monocrystalline silicon substrate, impurities for supplying charges are contained in silicon (Si) so as to impart electric conductivity to silicon (Si). In general, for the monocrystalline silicon substrate, there are an n type in which phosphorous atoms or the like for introducing electrons are supplied to Si atoms and a p-type in which boron atoms or the like for introducing holes are supplied to the Si atoms. When a hetero-junction solar battery is configured, hetero-junction on a light incident side where light made incident on the monocrystalline silicon substrate is absorbed most is formed as reverse junction to provide a strong electric field, whereby it is made possible to efficiently separate and collect electron-hole pairs. Therefore, it is preferable to form the hetero-junction on the light incident side as the reverse junction.

On the other hand, when holes and electrons are compared, in general, the electrons having small effective mass and a small scattering cross sectional area has larger mobility. From the above viewpoint, the monocrystalline silicon semiconductor substrate used in this embodiment is preferably an n-type monocrystalline silicon semiconductor substrate. In this case, it is preferable to form a p-type amorphous silicon thin film layer on a light incident surface and form the n-type amorphous silicon thin film layer on the rear surface. Therefore, in the explanation in this embodiment, the n-type monocrystalline silicon substrate 1 is used as the monocrystalline silicon substrate.

From the viewpoint of light confinement, it is preferable to form a reflection layer on the rear surface side transparent electrode 8 and the rear surface side collector electrode 9 on the rear surface side of the monocrystalline silicon substrate. The reflection layer means a layer for adding, to a solar battery, a function for reflecting light. For the reflection layer, for example, a metal layer of silver (Ag), aluminum (Al), or the like can be used. The reflection layer can be formed using a white high-reflection material containing particles of titanium oxide ($TiO_2$), barium nitrate ($BaSO_4$), magnesium oxide (MgO), or the like.

It is preferable that the n-type monocrystalline silicon substrate 1 is sliced such that a light incident surface (a light-receiving surface) is a (100) plane. This is because, when a monocrystalline silicon substrate is etched, a texture structure can be easily formed by anisotropic etching of the (100) plane and a (111) plane mutually having different etching rates. In general, a texture size is larger as etching of the monocrystalline silicon substrate surface further progresses. For example, the texture size is increased by increasing an etching time of the monocrystalline silicon substrate surface. The texture size can also be increased by attaining an increase in etchant concentration and etchant supply speed, a rise of etching liquid temperature, and the like such that reaction speed of the etching increases.

In a trough section (a concave section) having a sharp texture formed on the monocrystalline silicon substrate surface, a defect tends to occur because of compression reaction in formation of a thin film. Therefore, after the etching for texture formation, as a process for relaxing the shape of a trough (a concave section) and a ridge (a convex section) of the formed texture, it is preferable to perform isotropic etching having low selectivity of the (100) plane and the (111) plane.

The substantially intrinsic i-type amorphous silicon thin film layer 2 is preferably an i-type hydrogenated amorphous silicon layer provided between the n-type monocrystalline silicon substrate 1 and the p-type amorphous silicon thin film layer 3 and formed of, for example, silicon and hydrogen. In this case, during CVD film formation of the i-type hydrogenated amorphous silicon layer, it is possible to effectively perform passivation of the surface of the n-type monocrystalline silicon substrate 1 while suppressing impurity diffusion to the n-type monocrystalline silicon substrate 1.

The p-type amorphous silicon thin film layer 3 is preferably, for example, a p-type hydrogenated amorphous silicon layer or a p-type oxidized amorphous silicon layer. From the viewpoint of impurity diffusion and series resistance, it is preferable to use the p-type hydrogenated amorphous silicon layer as the p-type amorphous silicon thin film layer 3. On the other hand, from the viewpoint of ability to reduce an optical loss of a low-refractive index layer having a wide gap, it is also possible to use the p-type oxidized amorphous silicon layer as the p-type amorphous silicon thin film layer 3.

The substantially intrinsic i-type amorphous silicon thin film layer 4 is preferably an i-type hydrogenated amorphous silicon layer provided between the n-type monocrystalline silicon substrate 1 and the n-type amorphous silicon thin film layer 5 and formed of, for example, silicon and hydrogen.

For the n-type amorphous silicon thin film layer 5, it is preferable to use n-type hydrogenated amorphous silicon. In the crystalline silicon solar battery in this embodiment, the i-type amorphous silicon thin film layer 4, which is the i-type silicon thin film layer, and the n-type amorphous silicon thin film layer 5, which is the n-type silicon thin film layer, are formed on the rear surface of the n-type monocrystalline silicon substrate 1, whereby a so-called BSF (Back Surface Field) structure is formed.

A role of the light-receiving surface side transparent electrode 6 (the first transparent electrode 6a and the second transparent electrode 6b) and the rear surface side transparent electrode 8 is transportation of a carrier from the photoelectric conversion layer (the n-type monocrystalline silicon substrate 1) to the collector electrode. Electric conductivity for the transportation of the carrier is necessary.

The first transparent electrode 6a is formed in a region shaded by the light-receiving surface side collector electrode 7. Therefore, even if the first transparent electrode 6a is a transparent electrode having high carrier concentration and high electric conductivity, a light absorption loss does not increase. It is possible to improve a carrier transportation characteristic between the first transparent electrode 6a and the light-receiving surface side collector electrode 7. On the other hand, a part of the second transparent electrode 6b is located in an optical path of incident light to the photoelectric conversion layer (the n-type monocrystalline silicon substrate 1). Therefor, the second transparent electrode 6b needs to be set to carrier concentration and film thickness taking into account light transmissivity. The second transparent electrode 6b formed to cover the light-receiving surface side collector electrode 7 has an effect of increasing a contact area between the entire light-receiving surface side transparent electrode 6 and the light-receiving surface side collector electrode 7 to thereby reduce contact resistance and improve electrical conductivity from the light-receiving surface side transparent electrode 6 to the light-receiving surface side collector electrode 7. In addition, the second transparent electrode 6b has an effect of improving adhesion of the light-receiving surface side transparent electrode 6 and the light-receiving surface side collector electrode 7 and has an effect of protecting the light-receiving surface side collector electrode 7 because the light-receiving surface side collector electrode 7 is not exposed to the outside.

The first transparent electrode 6a, the second transparent electrode 6b, and the rear surface side transparent electrode 8 only have to be conductive films having light transmissivity. Conductive oxide materials such as indium oxide, zinc oxide, and tin oxide can be used independently or in mixture. Further, a conductive doping material can be added to these materials. Examples of a doping material added to indium oxide include zinc, tin, titanium, tungsten, molybdenum, silicon, and cerium. Examples of a doping material added to zinc oxide include aluminum, gallium, boron, silicon, and carbon. Examples of a doping material added to tin oxide include fluorine.

Examples of a film forming method of the first transparent electrode 6a, the second transparent electrode 6b, and the rear surface side transparent electrode 8 include a sputtering method and an MOCVD method. In particular, from the viewpoint of mass productivity, the sputtering method is preferable. A substrate temperature during transparent electrode manufacturing is preferably equal to or lower than 150° C. When the substrate temperature during the transparent electrode manufacturing is higher than 150° C., dangling bond occurs in Si atoms and sometimes can be a recombination center of the carrier.

In the present invention, it is important that carrier concentrations of conductive oxide material used in the first transparent electrode 6a and the second transparent electrode 6b are different. In general, the carrier concentration of a conductive oxide used as a transparent electrode of a photoelectric conversion device is about $1 \times 10^{18}$ to $1 \times 10^{21}$ cm-3. It is preferable that the carrier concentration of the second transparent electrode 6b is present in this range. At carrier concentration lower than this range, it is difficult to develop electric conductivity sufficient for an electrode. At carrier concentration exceeding this range, transparency is sometimes deteriorated because of absorption and reflection by free electrons.

On the other hand, the carrier concentration of metal used in the light-receiving surface side collector electrode 7 is about $1 \times 10^{29}$ cm$^{-3}$. It is preferable that the carrier concentration of the first transparent electrode 6a is present between the carrier concentration of the second transparent electrode 6b and the carrier concentration of the light-receiving surface side collector electrode 7. Specifically, the carrier concentration of the first transparent electrode 6a is preferably $1 \times 10^{21}$ to $5 \times 10^{23}$ cm$^{-3}$ and more preferably $3 \times 10^{21}$ to $1 \times 10^{23}$ cm$^{-3}$. Because the carrier concentrations are present in these ranges, it is possible to improve the carrier transportation function from the light-receiving surface side transparent electrode 6 to the light-receiving surface side collector electrode 7 while suppressing a carrier transportation loss on a junction interface between the first transparent electrode 6a and the second transparent electrode 6b. It is possible to attain a reduction in series resistance of the solar battery and improvement of photoelectric conversion efficiency along with this reduction.

Silver (Ag), copper (Cu), or the like is used in the light-receiving surface side collector electrode 7 and the rear surface side collector electrode 9 from the viewpoint of conductivity. The electrodes are formed in a comb shape by, for example, a method of printing a paste electrode formed by fine powder of metal and thermosetting resin, or a plating method. In this embodiment, by covering the collector electrode with a transparent electrode, it is possible to prevent deterioration in an electric characteristic of the collector electrode due to migration or the like of metal. In particular, Cu tends to be oxidized in the atmosphere compared with Ag. However, it is possible to suppress oxidization of the collector electrode according to this embodiment. By covering the collector electrode with a transparent electrode made of an inorganic material having water permeability lower than the water permeability of an organic material, it is possible to realize a module less deteriorated by moisture than a module sealed by setting a resin material in contact with the collector electrode.

A manufacturing method of the crystalline silicon solar battery according to the first embodiment configured as explained above is explained with reference to FIG. 2-1 to FIG. 2-6. FIG. 2-1 to FIG. 2-6 are sectional views for explaining an example of a procedure of the manufacturing method of the crystalline silicon solar battery according to the first embodiment.

First, the n-type monocrystalline silicon substrate 1 including an uneven structure called texture on the surface is formed. That is, after a crystalline silicon substrate is sliced from an ingot of n-type monocrystalline silicon such that a principal plane is a (100) plane, an uneven structure is formed on the surface of the crystalline silicon substrate by wet etching using an alkali solution such as a NaOH solution or a KOH solution. In a silicon substrate, etching speed by the alkali solution is different depending on a plane orientation. Therefore, for example, when a silicon substrate, a plane orientation of which is (100), is etched, a (111) plane to be less easily etched appears in an oblique direction. Finally, an uneven structure having a pyramid shape is applied on the silicon substrate. Consequently, the n-type monocrystalline silicon substrate 1 having texture on the surface is obtained. Note that, in the figures, the texture is not shown.

Figure 21:
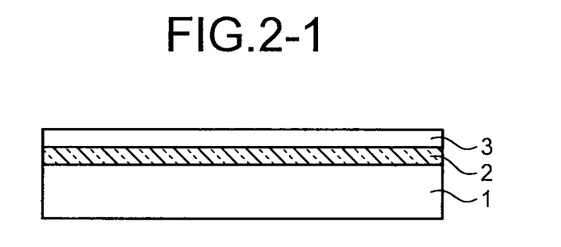

Subsequently, for example, an i-type hydrogenated amorphous silicon layer is formed on one surface side (a light incident surface side) of the n-type monocrystalline silicon substrate 1 as the substantially intrinsic i-type amorphous silicon thin film layer 2. Subsequently, for example, a p-type hydrogenated amorphous silicon layer is formed on the i-type amorphous silicon thin film layer 2 as the p-type amorphous silicon thin film layer 3 (FIG. 2-1).

Figure 22:
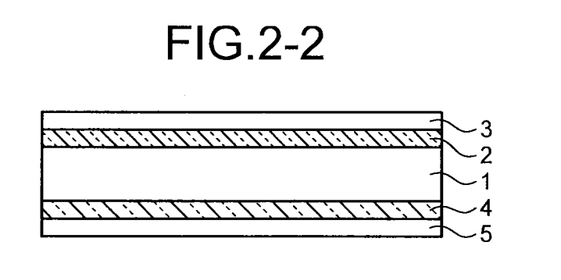

Subsequently, for example, an i-type hydrogenated amorphous silicon layer is formed on the other surface side (the rear surface side) of the n-type monocrystalline silicon substrate 1 as the substantially intrinsic i-type amorphous silicon thin film layer 4. Subsequently, for example, an n-type hydrogenated amorphous silicon layer is formed on the i-type amorphous silicon thin film layer 4 as the n-type amorphous silicon thin film layer 5 to form a BSF structure (FIG. 2-2).

As a film forming method for an amorphous silicon thin film on the n-type monocrystalline silicon substrate 1, it is preferable to use, in particular, a plasma CVD method. As formation conditions for a silicon thin film formed by using the plasma CVD method, for example, a substrate temperature of 100 to 300° C., pressure of 5 to 100 Pa, and high-frequency power density of 1 mW/cm$^2$ to 500 mW/cm$^2$ are preferable. As a material gas used for formation of the amorphous silicon thin film, a silane containing gas such as silane ($SiH_4$) or disilane ($Si_2H_6$) or a mixture of the silane containing gas and hydrogen ($H_2$) is used.

Examples of a dopant for forming a p-type amorphous silicon thin film include boron (B), aluminum (Al), gallium (Ga), and indium (In), which are group III elements. Examples of a dopant for forming an n-type amorphous silicon thin film include nitrogen (N), phosphorus (P), arsenide (As), and antimony (Sb), which are group V elements. By mixing a compound gas including at least one of the dopants in a material gas during formation of the amorphous silicon thin film, it is possible to form a desired p-type or n-type amorphous silicon thin film.

Figure 23:
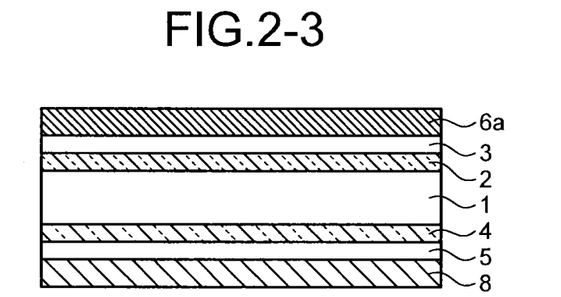

Subsequently, for example, a zinc oxide film is formed on the entire surface of the p-type amorphous silicon thin film layer 3 as the first transparent electrode 6a. For example, a zinc oxide film is formed on the entire surface of the n-type amorphous silicon thin film layer 5 as the rear surface side transparent electrode 8 (FIG. 2-3). As a film forming method for the first transparent electrode 6a and the rear surface side transparent electrode 8, for example, the sputtering method or the MOCVD method can be used.

Figure 24:
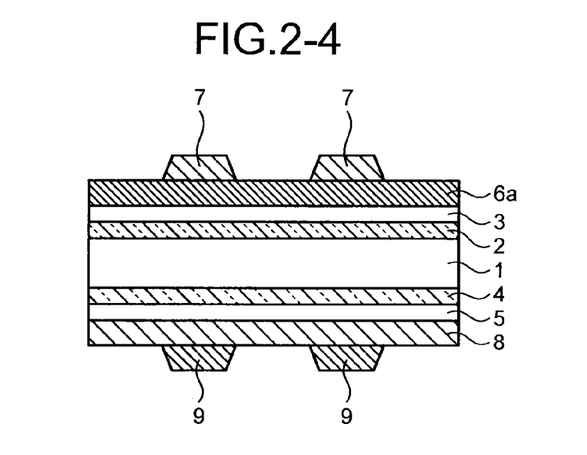

Subsequently, the light-receiving surface side collector electrode 7 is formed in a predetermined position on the first transparent electrode 6a. The rear surface side collector electrode 9 is formed in a predetermined position on the rear surface side transparent electrode 8 (FIG. 2-4). For the formation of the light-receiving surface side collector electrode 7 and the rear surface side collector electrode 9, a publicly-known technology such as inkjet, screen printing, lead wire bonding, or spray can be used. However, from the viewpoint of productivity, the screen printing is preferable.

The light-receiving surface side collector electrode 7 and the rear surface side collector electrode 9 are formed by forming, using, for example, silver (Ag) paste obtained by kneading fine powder of silver (Ag) in epoxy resin, a finger section and a bus bar section (not shown in the figures) at dimensions of height of about 10 micrometers to 30 micrometers and width of 100 micrometers to 500 micrometers with the screen printing method and burning and hardening the finger section and the bus bar section at 100° C. to 250° C. In the finger section, a plurality of lines are formed in parallel to one another at an interval of 1 millimeters to 10 millimeters. The bus bar section is connected to the finger section and collects electric currents flowing to the finger section. When the light-receiving surface side collector electrode 7 and the rear surface side collector electrode 9 are formed by the screen printing, a center portion is thick and an edge portion spreads to be thin in a cross section perpendicular to the longitudinal direction.

Figure 25:
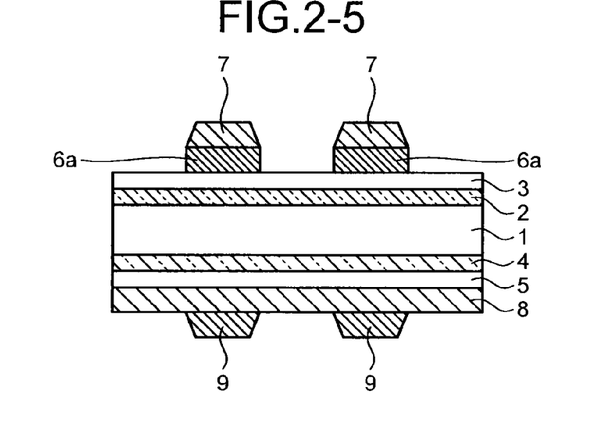

Subsequently, the first transparent electrode 6a is subjected to anisotropic etching using the light-receiving surface side collector electrode 7 as a mask to pattern the first transparent electrode 6a (FIG. 2-5). By removing the first transparent electrode 6a in a region other than a region right under the light-receiving surface side collector electrode 7 with this method, it is possible to accurately form the first transparent electrode 6a having a shape same as that of the light-receiving surface side collector electrode 7 right under the light-receiving surface side collector electrode 7 without requiring alignment or the like.

Examples of such an etching method include a dry etching method for performing etching using a reactive gas or the like and a wet etching method for performing etching using a solution. The wet etching method is used when an acid-soluble conductive oxide is used as the material of the first transparent electrode 6a. The wet etching method is used for, for example, indium oxide, zinc oxide, materials obtained by adding a small amount of metal oxides in a range for not substantially spoiling the acid solubility of conductive oxides of the indium oxide and the zinc oxide (e.g., tin-doped indium oxide (ITO), aluminum-doped zinc oxide (AZO), and gallium-doped zinc oxide (GZO)), and a mixture (IZO) of indium oxide and zinc oxide. In particular, the etching method is suitable for patterning performed using a metal oxide layer including zinc oxide as the first transparent electrode 6a among these oxides. As etching liquid, a water solution containing hydrochloric acid, oxalic acid, sulfuric acid, hydrobromic acid, or mixed acid of these acids is mainly used.

Figure 26:
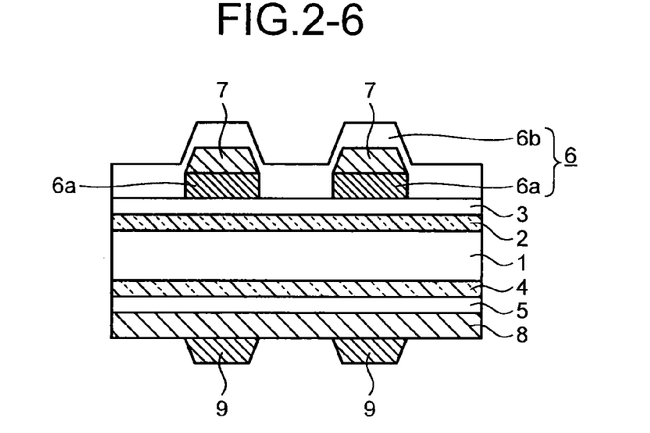

Subsequently, on the one surface side (the light incident surface side) of the n-type monocrystalline silicon substrate 1, the second transparent electrode 6b is formed in a region on the p-type amorphous silicon thin film layer 3 where the light-receiving surface side collector electrode 7 is not formed and on the light-receiving surface side collector electrode 7 (FIG. 2-6). The second transparent electrode 6b is located on an optical path of incident light. Therefore, it is preferable that the film thickness of the second transparent electrode 6b is 50 nanometers to 200 nanometers from the viewpoint of electric conductivity and light transmissivity. When the first transparent electrode 6a is thinner than the second transparent electrode 6b, because of the shape of the light-receiving surface side collector electrode 7 having a thin edge portion, as shown in FIG. 2-6, the second transparent electrode 6b is formed to cover the first transparent electrode 6a and the light-receiving surface side collector electrode 7. Consequently, there are effects that adhesion of the light-receiving surface side transparent electrode 6 and the light-receiving surface side collector electrode 7 is improved and contact resistance between the light-receiving surface side transparent electrode 6 and the light-receiving surface side collector electrode 7 decreases because a contact area of the light-receiving surface side transparent electrode 6 and the light-receiving surface side collector electrode 7 increases. The film thickness of the first transparent electrode 6a at this point is preferably 10 nanometers to 100 nanometers and more preferably 10 nanometers to 50 nanometers. By carrying out the process explained above, the crystalline silicon solar battery having the structure shown in FIG. 1 is obtained.

By coating these layers with a film such as ethylene vinyl acetate (EVA) resin functioning as a protection layer, it is possible to improve physical strength of the crystalline silicon solar battery. Further, it is possible to play a role for preventing deterioration in a silicon layer and an electrode layer due to oxygen and moisture.

In the crystalline silicon solar battery according to the first embodiment explained above, on the light incident surface side, the second transparent electrode 6b having high light transmissivity and electric conductivity is formed in the optical path of incident light and the first transparent electrode 6a having high carrier concentration and high electric conductivity is formed only in the region right under the light-receiving surface side collector electrode 7 shaded by the light-receiving surface side collector electrode 7. Consequently, a light absorption loss due to the transparent electrodes does not increase. Electric joining of the light-receiving surface side transparent electrode 6 and the light-receiving surface side collector electrode 7 is satisfactorily performed. It is possible to reduce a series resistance component of the crystalline silicon solar battery and improve photoelectric conversion efficiency.

Further, the second transparent electrode 6b formed on the light-receiving surface side collector electrode 7 has an effect of reducing resistance by increasing a sectional area of the entire light-receiving surface side transparent electrode 6 and improving electric conductivity from the light-receiving surface side transparent electrode 6 to the light-receiving surface side collector electrode 7. It is possible to reduce a series resistance component of the crystalline silicon solar battery and improve photoelectric conversion efficiency. When the second transparent electrode 6b formed on the light-receiving surface side collector electrode 7 is separated from the second transparent electrode 6b formed in the region where the light-receiving surface side collector electrode 7 is not provided, the second transparent electrode 6b formed on the light-receiving surface side collector electrode 7 has an effect of functioning as a part of the light-receiving surface side collector electrode 7 and increasing a sectional area of the entire light-receiving surface side collector electrode 7 to thereby reduce resistance and improve the electric conductivity of the light-receiving surface side collector electrode 7.

By etching the first transparent electrode 6a formed on the entire surface on the p-type amorphous silicon thin film layer 3 using the light-receiving surface side collector electrode 7 as a mask, it is possible to easily form the first transparent electrode 6a having width same as that of the light-receiving surface side collector electrode 7 right under the light-receiving surface side collector electrode 7 without requiring processing such as alignment. When positional deviation between the light-receiving surface side collector electrode 7 and the first transparent electrode 6a, which is a high-carrier concentration layer, or deviation of electrode width occurs, a light absorption loss due to the first transparent electrode 6a exposed from the light-receiving surface side collector electrode 7 is likely to occur.

However, in the first embodiment, the first transparent electrode 6a is etched and patterned using the light-receiving surface side collector electrode 7 as a mask. Therefore, positional deviation between the light-receiving surface side collector electrode 7 and the first transparent electrode 6a or deviation of electrode width does not occur. Performance deterioration due to positional deviation between the light-receiving surface side collector electrode 7 and the first transparent electrode 6a or deviation of electrode width does not occur and satisfactory photoelectric conversion efficiency is obtained.

Further, the first transparent electrode 6a and the second transparent electrode 6b are separately formed. Therefore, it is possible to form the first transparent electrode 6a and the second transparent electrode 6b at different film thicknesses. The second transparent electrode 6b is formed to cover the light-receiving surface side collector electrode 7 by forming the first transparent electrode 6a thinner than the second transparent electrode 6b. Consequently, there are effects that adhesion of the light-receiving surface side transparent electrode 6 and the light-receiving surface side collector electrode 7 is improved and contact resistance between the light-receiving surface side transparent electrode 6 and the light-receiving surface side collector electrode 7 decreases because a contact area of the light-receiving surface side transparent electrode 6 and the light-receiving surface side collector electrode 7 increases.

Therefore, according to the first embodiment, it is possible to obtain a crystalline silicon solar battery excellent in photoelectric conversion efficiency with a light absorption loss due to the transparent electrode suppressed and a series resistance component in current extraction reduced.

Second Embodiment

Figure 3:
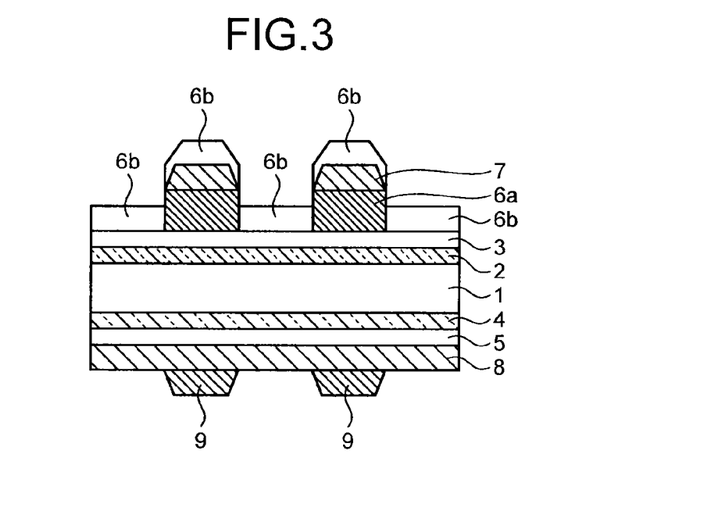
FIG. 3 is a main part sectional view of the schematic configuration of a crystalline silicon solar battery according to a second embodiment of the present invention.

FIG. 3 is a main part sectional view of the schematic configuration of a crystalline silicon solar battery according to a second embodiment of the present invention. In an explanation in the second embodiment, the film thickness of the first transparent electrode 6a is formed sufficiently larger than the film thickness of the second transparent electrode 6b in the crystalline silicon solar battery explained in the first embodiment. The other components in the crystalline silicon solar battery according to the second embodiment are the same as the components in the crystalline silicon solar battery according to the first embodiment. Therefore, detailed explanation of the components is omitted.

In the crystalline silicon solar battery according to the second embodiment, as shown in FIG. 3, the film thickness of the first transparent electrode 6a is formed sufficiently larger than the film thickness of the second transparent electrode 6b.

The second transparent electrode 6b is formed in a region on the p-type amorphous silicon thin film layer 3 where the light-receiving surface side collector electrode 7 is not present and on the light-receiving surface side collector electrode 7 to be formed in contact with a side section of the first transparent electrode 6a. Consequently, a contact area of the first transparent electrode 6a and the second transparent electrode 6b increases. Therefore, contact resistance can be reduced and electric connection between the first transparent electrode 6a and the second transparent electrode 6b is performed satisfactorily. It is possible to improve photoelectric conversion efficiency. In this case, when the second transparent electrode 6b is formed by a film forming method having strong anisotropy such as vapor deposition, the second transparent electrode 6b is separately formed in the region where the light-receiving surface side collector electrode 7 is not present and on the light-receiving surface side collector electrode 7. However, when the second transparent electrode 6b is formed by a film forming method having weak anisotropy such as the sputtering method, the second transparent electrode 6b is formed to cover the entire side surface of the first transparent electrode 6a. As in the first embodiment, effects such as a reduction in contact resistance and improvement of adhesion by an increase in the contact area and protection of a metal electrode are obtained.

The thick transparent electrode is easily roughened. That is, because the first transparent electrode 6a, which is a high-carrier concentration layer, has been increased in thickness, the surface of the first transparent electrode 6a can be easily roughened. Consequently, there are effects that it is possible to roughen the surface of the first transparent electrode 6a and easily increase the contact area of the first transparent electrode 6a and the light-receiving surface side collector electrode 7, so that it is possible to reduce contact resistance between the first transparent electrode 6a and the light-receiving surface side collector electrode 7.

It is preferable that the film thickness of the second transparent electrode 6b is 50 nanometers to 200 nanometers as in the first embodiment and the film thickness of the first transparent electrode 6a is 200 nanometers to 500 nanometers.

The crystalline silicon solar battery according to the second embodiment is manufactured the same as the crystalline silicon solar battery according to the first embodiment except that the film thickness of the first transparent electrode 6a is formed sufficiently larger than the film thickness of the second transparent electrode 6b.

Therefore, according to the second embodiment, as in the first embodiment, it is possible to obtain a crystalline silicon solar battery excellent in photoelectric conversion efficiency with a series resistance component in current extraction reduced.

According to the second embodiment, the film thickness of the first transparent electrode 6a is formed sufficiently larger than the film thickness of the second transparent electrode 6b and the contact area of the first transparent electrode 6a and the second transparent electrode 6b increases. Therefore, electric connection between the first transparent electrode 6a and the second transparent electrode 6b is performed satisfactorily according to a decrease in contact resistance. It is possible to improve photoelectric conversion efficiency.

Third Embodiment

Figure 4:
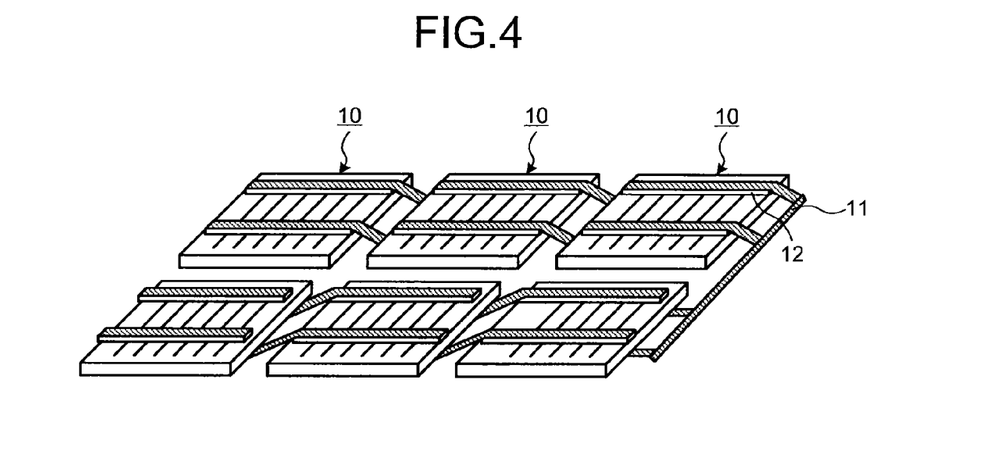
FIG. 4 is a main part sectional view of the schematic configuration of a crystalline silicon solar battery module according to a third embodiment of the present invention.
Figure 5:
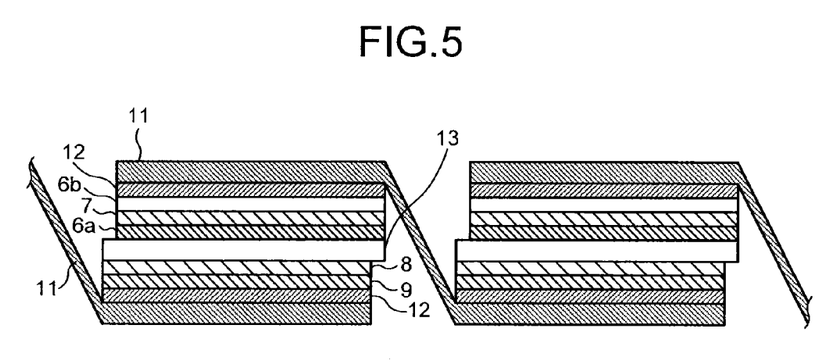
FIG. 5 is a sectional enlarged view of a connecting section of solar battery cells in the crystalline silicon solar battery module according to the third embodiment of the present invention.

FIG. 4 is a perspective view of the schematic configuration of a crystalline silicon solar battery module according to a third embodiment of the present invention. FIG. 5 is a sectional enlarged view of a connecting section of solar battery cells in the crystalline silicon solar battery module according to the third embodiment of the present invention. In the crystalline silicon solar battery module according to the third embodiment, a pair or more of the crystalline silicon solar battery cells explained in the first embodiment or the second embodiment are electrically connected in series or in parallel as solar battery cells. A conductive film and a pressure joint method are used for formation of a connecting section of a tab line and a collector electrode. A crystalline silicon solar battery module in which solar battery cells 10 are connected in series is explained below.

Connection of the solar battery cells 10 is performed using a tab line 11 formed using Ag or Cu. That is, a collector electrode on a light-receiving surface side of certain one solar battery cell 10 and a collector electrode on the rear surface side of the solar battery cell 10 adjacent to one side of the solar battery cell 10 are connected. A collector electrode on the rear surface side of the solar battery cell 10 and a collector electrode on a light-receiving surface side of the solar battery cell 10 adjacent to the other side of the solar battery cell 10 are connected. The same connection is performed concerning a plurality of solar battery cells. Consequently, one crystalline silicon solar battery module is configured.

It is necessary to extract electricity generated in the photoelectric conversion layer 13 of the solar battery cell 10 to the outside by joining the tab line 11 on the collector electrode of the solar battery cell 10. In general, solder joining is used for the joining of the collector electrode and the tab line 11. However, with the solder joining, solder disperses on metal to be alloyed to obtain satisfactory joining. Therefore, in a structure including the transparent electrode on the light-receiving surface side collector electrode 7 like the solar battery in the embodiment, it is likely that peeling and a connection failure occur at the interface between the transparent electrode and the tab line 11.

On the other hand, a conductive film 12 formed by dispersing conductive particles in thermosetting resin conducts through heating and pressurization and, at the same time, the resin is thermally set, whereby sure conduction at a level equivalent to the solder joining can be obtained. The thermosetting resin can be joined to the transparent electrode like metal. Therefore, in the crystalline silicon solar battery module according to this embodiment, the conductive film 12 is held between the collector electrode of the solar battery cell 10 and the tab line 11 and compression-bonded. Consequently, a mechanical and electrical joining section of the collector electrode and the tab line 11 is formed. Note that, in the photoelectric conversion layer 13 shown in FIG. 5, the n-type monocrystalline silicon substrate 1, the i-type amorphous silicon thin film layer 2, the p-type amorphous silicon thin film layer 3, the i-type amorphous silicon thin film layer 4, and the n-type amorphous silicon thin film layer 5 are collectively shown.

Therefore, with the crystalline silicon solar battery cell module according to the third embodiment, the transparent electrode and the tab line 11 for connecting the solar battery cells 10 are satisfactorily joined. It is possible to obtain a solar battery module having high efficiency and excellent in reliability.

EXAMPLES

The present invention is explained on the basis of specific examples. Note that the present invention is not limited to the following description.

Example 1

As an example of the present invention, the crystalline silicon solar battery cell having the structure shown in FIG. 1 was manufactured according to the method explained in the embodiment. First, as the n-type monocrystalline silicon substrate 1, a substrate was prepared that had thickness of about 200 micrometers, a principal plane of which included a (100) plane, and on the surface of which pyramid-like concaves and convexes for light confinement having height of several micrometers to several ten micrometers were formed.

On one surface side (an incident surface side) of the n-type monocrystalline silicon substrate 1, an i-type hydrogenated amorphous silicon layer having thickness of about 5 nanometers was formed as the substantially intrinsic i-type amorphous silicon thin film layer 2 using the plasma CVD method. On the i-type amorphous silicon thin film layer 2, a p-type hydrogenated amorphous silicon layer having thickness of about 7 nanometers was formed as the p-type amorphous silicon thin film layer 3 using the plasma CVD method.

Subsequently, on the other surface side (a rear surface side) of the n-type monocrystalline silicon substrate 1, an i-type hydrogenated amorphous silicon layer having thickness of about 5 nanometers was formed as the substantially intrinsic i-type amorphous silicon thin film layer 4 using the plasma CVD method. On the i-type amorphous silicon thin film layer 4, an n-type hydrogenated amorphous silicon layer having thickness of about 10 nanometers was formed as the n-type amorphous silicon thin film layer 5 using the plasma CVD method to form a BSF structure.

Subsequently, the first transparent electrode 6a was formed at thickness of 50 nanometers over the entire surface on the p-type amorphous silicon thin film layer 3 using the sputtering method. In the formation of the first transparent electrode 6a, zinc oxide doped with 3 weight % of aluminum (3 wt % AZO) was used as a target material. The substrate temperature was set to 150 degrees. In this case, the carrier concentration of the 3 wt % AZO formed on a glass substrate under conditions same as those for the formation of the first transparent electrode 6a was $1 \times 10^{21}$ cm$^{-3}$.

Subsequently, the rear surface side transparent electrode 8 was formed at thickness of 110 nanometers over the entire surface on the n-type amorphous silicon thin film layer 5 using the sputtering method. In the formation of the rear surface side transparent electrode 8, tin-doped indium oxide (3 wt % TIO: containing 3 weight % of tin oxide) was used as a target material. The substrate temperature was set to 150 degrees. In this case, the carrier concentration of the 3 wt % ITO formed on a glass substrate under conditions same as those for the formation of the rear surface side transparent electrode 8 was $3 \times 10^{20}$ cm$^{-3}$.

Subsequently, silver paste was screen-printed in a predetermined position on the first transparent electrode 6a to form a comb-shaped electrode as the light-receiving surface side collector electrode 7. The silver paste was screen-printed in a predetermined position on the rear surface side transparent electrode 8 to form a comb-shaped electrode as the rear surface side collector electrode 9. In the respective electrodes, the width of the electrode was set to 500 micrometers and an interval of a finger section was set to 5 millimeters.

Subsequently, the first transparent electrode 6a was wet-etched using the light-receiving surface side collector electrode 7 as a mask to remove the first transparent electrode 6a in a region other than a region right under the light-receiving surface side collector electrode 7. As etching liquid, a 0.3% hydrochloric acid aqueous solution was used.

Subsequently, the second transparent electrode 6b was formed over the entire surface on the incident surface side of the n-type monocrystalline silicon substrate 1 to cover the light-receiving surface side collector electrode 7 and the first transparent electrode 6a. In the formation of the second transparent electrode 6b, zinc oxide doped with 0.5 weight % of aluminum (0.5 wt % AZO) was used as a target material. The substrate temperature was set to 150 degrees. In this case, the carrier concentration of the 0.5 wt % AZO formed on a glass substrate under conditions same as those for the formation of the rear surface side transparent electrode 8 was $3 \times 10^{20}$ cm$^{-3}$. Consequently, the second transparent electrode 6b was formed in a region on the p-type amorphous silicon thin film layer 3 where the light-receiving surface side collector electrode 7 was not provided and on the light-receiving surface side collector electrode 7 and was in contact with the p-type amorphous silicon thin film layer 3, the light-receiving surface side collector electrode 7, and the first transparent electrode 6a.

In this case, a reflection preventing effect by optical interference can be obtained by, in addition to making electric conductivity and the light transmissivity compatible, designing the film thickness of the second transparent electrode 6b taking into account a diffractive index difference between EVA resin laminated on the second transparent electrode 6b and the second transparent electrode 6b. Consequently, it is possible to efficiently reflect reflected light by the light-receiving surface side collector electrode 7 again and make the reflected light incident in the n-type monocrystalline silicon substrate 1. In this example, the refractive index of the EVA resin was set to 1.5, the refractive index of the second transparent electrode 6b was set to 1.9, and the film thickness of the second transparent electrode 6b was set to 110 nanometers. Finally, these layers were coated with an EVA resin film functioning as a protection layer to obtain the crystalline silicon solar battery cell in the example 1.

Example 2

Tin-doped indium oxide layer (10 wt % ITO: containing 10 weight % of tin oxide) having thickness of 50 nanometers was used in the first transparent electrode 6a. Tin-doped indium oxide layer (3 wt % ITO: containing 3 weight % of tin oxide) having thickness of 100 nanometers was used in the second transparent electrode 6b. A laminated structure of the first transparent electrode 6a and the light-receiving surface side collector electrode 7 was formed by reactive ion etching (RIE) in a vacuum chamber. As an etching gas, a mixed gas of methane gas and hydrogen was used. In this case, the carrier concentrations of 10 wt % ITO and 3 wt % ITO formed on a glass substrate under the same conditions were respectively $8 \times 10^{20}$ cm$^{-3}$ and $3 \times 10^{20}$ cm$^{-3}$. A crystalline silicon solar battery cell in an example 2 was manufactured in the same manner as in the example 1 except the first transparent electrode 6a and the second transparent electrode 6b.

Comparative Example

A crystalline silicon solar battery cell in a comparative example was manufactured in the same manner as in the example 1 except that tin-doped indium oxide (3 wt % ITO: containing 3 weight % of tin oxide) was formed over the entire surface on the p-type amorphous silicon thin film layer 3 as a transparent electrode with thickness of 100 nanometers and the light-receiving surface side collector electrode 7 was formed on the transparent electrode.

Photoelectric conversion characteristics of the solar battery cells in the example 1, the example 2, and the comparative example manufactured as explained above were evaluated using a solar simulator. Short-circuit currents (mA/cm$^2$), open-circuit voltage (V), fill factors, and photoelectric conversion efficiencies (%) of the crystalline silicon solar battery cells are shown in Table 1.

TABLE 1

| | Short-circuit current (mA/cm$^2$) | Open-circuit voltage (V) | Fill factor | Photoelectric conversion efficiency (%) |
|---|---|---|---|---|
| Example 1 | 37.05 | 0.684 | 0.765 | 19.39 |
| Example 2 | 36.98 | 0.685 | 0.764 | 19.35 |
| Comparative example | 36.99 | 0.685 | 0.753 | 19.08 |

It is seen from Table 1 that high photoelectric conversion characteristics are obtained in the example 1 and the example 2 compared with the comparative example. That is, it is seen that, with the structure of the present invention, it is possible to improve, in particular, the fill factor among the solar battery characteristics by setting the carrier concentration high only in the region right under the light-receiving surface side collector electrode 7 near the joining section of the light-receiving surface side transparent electrode 6 and the light-receiving surface side collector electrode 7, and providing the second transparent electrode 6b having low carrier concentration on the light-receiving surface side collector electrode 7. In this case, it is seen that the short-circuit current does not decrease because the first transparent electrode 6a does not spoil the light transmissivity of the transparent electrode on an optical path of low-carrier incident light.

A solar battery module excellent in photoelectric conversion efficiency can be realized by forming a plurality of the crystalline silicon solar battery cells having the configuration explained in the embodiments and electrically connecting, in series or in parallel, the crystalline silicon solar battery cells adjacent to each other. In this case, for example, the light-receiving surface side collector electrode 7 of one of the adjacent crystalline silicon solar battery cells and the rear surface side collector electrode 9 of the other only have to be electrically connected.

Note that, in the embodiments and the examples, the hetero-junction solar battery cell including the monocrystalline silicon substrate is explained. However, the present invention is not limited to this and can be applied to a solar battery having a structure including a transparent electrode and a collector electrode on a light incident surface.

INDUSTRIAL APPLICABILITY

As explained above, the solar battery according to the present invention is useful for realization of a solar battery excellent in photoelectric conversion efficiency with series resistance in the battery reduced.

REFERENCE SIGNS LIST 1 n-type monocrystalline silicon substrate
2 i-type amorphous silicon thin film layer
3 p-type amorphous silicon thin film layer
4 i-type amorphous silicon thin film layer
5 n-type amorphous silicon thin film layer
6 Light-receiving surface side transparent electrode
6a First transparent electrode
6b Second transparent electrode
7 Light-receiving surface side collector electrode
8 Rear surface side transparent electrode
9 Rear surface side collector electrode 10 Solar battery cell
11 Tab line
12 Conductive film
13 Photoelectric conversion layer

The invention claimed is:

1. A manufacturing method of a solar battery, comprising, in the following order:
forming a first transparent electrode over an entire surface of a photoelectric conversion layer;
forming a collector electrode in a specific region on the first transparent electrode;
etching the first transparent electrode with the collector electrode as a mask to remove the first transparent electrode in a region other than the region right under the collector electrode; and
forming, on the photoelectric conversion layer and on the collector electrode, a second transparent electrode having carrier concentration lower than carrier concentration of the first transparent electrode.

2. The method of claim 1, wherein, in the forming of the second transparent electrode, a film thickness of the second transparent electrode is set thicker than a film thickness of the first transparent electrode, and the second transparent electrode is formed to cover the collector electrode in contact with the collector electrode.

3. The method of claim 1, wherein, in the forming of the second transparent electrode, a film thickness of the second transparent electrode is set thinner than a film thickness of the first transparent electrode, and the second transparent electrode is formed on the photoelectric conversion layer in contact with a side section of the first transparent electrode.

4. The method of claim 3, wherein the second transparent electrode is formed by a sputtering method and formed to cover the first transparent electrode and the collector electrode.

5. The method of claim 3, wherein the second transparent electrode is formed by an evaporation method and separately formed in a region on the photoelectric conversion layer where the collector electrode is not formed and on the collector electrode.

6. The method of claim 1, wherein the first transparent electrode and the second transparent electrode are each formed of one kind of a conductive oxide material or formed by mixing a plurality of conductive oxide materials.

7. The method of claim 6, wherein the conductive oxide material is indium oxide, zinc oxide, or tin oxide.

8. The method of claim 6, wherein, in the etching, the first transparent electrode formed of the conductive oxide material is etched by dry etching with a reactive gas.

9. The method of claim 6, wherein, in the etching, the first transparent electrode formed of the conductive oxide material having acid-solubility is etched by wet etching using, as etching liquid, a water solution comprising acid.

* * * * *